US011339310B2

(12) United States Patent
Onishi et al.

(10) Patent No.: US 11,339,310 B2
(45) Date of Patent: May 24, 2022

(54) POLISHING COMPOSITION

(71) Applicant: FUJIMI INCORPORATED, Aichi (JP)

(72) Inventors: Shogo Onishi, Aichi (JP); Yukari Uehara, Aichi (JP); Kenichi Komoto, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 16/495,442

(22) PCT Filed: Mar. 9, 2018

(86) PCT No.: PCT/JP2018/009315
§ 371 (c)(1),
(2) Date: Sep. 19, 2019

(87) PCT Pub. No.: WO2018/173814
PCT Pub. Date: Sep. 27, 2018

(65) Prior Publication Data
US 2020/0062997 A1    Feb. 27, 2020

(30) Foreign Application Priority Data

Mar. 22, 2017  (JP) .............................. JP2017-056433

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| 6,083,419 | A * | 7/2000 | Grumbine | ................. | C23F 3/00 |
| | | | | | 252/79.1 |
| 9,528,030 | B1 | 12/2016 | Kraft et al. | | |
| 2003/0086820 | A1* | 5/2003 | McDonnell | ........... | A61K 31/327 |
| | | | | | 422/28 |
| 2006/0062751 | A1* | 3/2006 | Sato | ........................ | A61Q 19/10 |
| | | | | | 424/70.22 |
| 2007/0093182 | A1* | 4/2007 | Kollodge | ............ | H01L 21/3212 |
| | | | | | 451/41 |
| 2009/0090888 | A1 | 4/2009 | Chang | | |
| 2009/0184287 | A1* | 7/2009 | Chang | ............... | H01L 21/02074 |
| | | | | | 252/79.1 |
| 2010/0159698 | A1* | 6/2010 | McConnell | ......... | H01L 21/3212 |
| | | | | | 438/693 |
| 2010/0167547 | A1* | 7/2010 | Kamimura | .......... | H01L 21/3212 |
| | | | | | 438/693 |
| 2010/0193728 | A1 | 8/2010 | Chang et al. | | |
| 2015/0344738 | A1* | 12/2015 | Onishi | ................ | H01L 21/3212 |
| | | | | | 438/692 |
| 2016/0107289 | A1* | 4/2016 | Cavanaugh | .............. | C09G 1/02 |
| | | | | | 216/53 |
| 2016/0115353 | A1* | 4/2016 | Kraft | .......................... | C23F 3/04 |
| | | | | | 438/693 |
| 2016/0229023 | A1* | 8/2016 | Lugg | ....................... | B24B 37/22 |
| 2016/0237315 | A1* | 8/2016 | Stender | .................... | C09G 1/02 |

FOREIGN PATENT DOCUMENTS

| CN | 101525751 | A | 9/2009 |
| CN | 104263248 | A | 1/2015 |
| JP | 2009-081300 | A | 4/2009 |
| JP | 2009-267325 | A | 11/2009 |
| JP | 2010-153626 | A | 7/2010 |
| JP | 2011-505694 | A | 2/2011 |
| JP | 2012-74734 | A | 4/2012 |
| JP | 2013-080751 | A | 5/2013 |
| JP | 2013-089819 | A | 5/2013 |
| JP | 2014-507799 | A | 3/2014 |
| JP | 2016-167580 | A | 9/2016 |
| JP | 2017-011225 | A | 1/2017 |
| WO | 2016/065057 | A1 | 4/2016 |
| WO | 2016/065067 | A1 | 4/2016 |
| WO | 2017/186283 | A1 | 11/2017 |

OTHER PUBLICATIONS

Official Notice of Reason for Refusal for JP Patent Application No. 2017-056433, dated Oct. 20, 2020.
Office Action for TW Application No. 11020523000 dated Jun. 2, 2021.

* cited by examiner

*Primary Examiner* — Shamim Ahmed
(74) *Attorney, Agent, or Firm* — Katten Muchin Rosenman LLP

(57) ABSTRACT

The present invention provides a polishing composition having a high polishing speed and a low etching speed and capable of achieving sufficient flattening.
The present invention is a polishing composition containing abrasive grains, an oxidizing agent, an acid, an anticorrosive containing a compound represented by the following formula (1) or a salt thereof, and a dispersing medium.

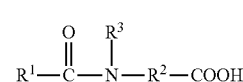

(1)

(In the formula (1), $R^1$ is a linear or branched alkyl group having 6 or more and 30 or less carbon atoms or a linear or branched alkenyl group having 6 or more and 30 or less carbon atoms, $R^2$ is a single bond or an alkylene group having 1 or more and 4 or less carbon atoms, and $R^3$ is a hydrogen atom or a linear or branched alkyl group having 1 or more and 10 or less carbon atoms.)

15 Claims, No Drawings

POLISHING COMPOSITION

TECHNICAL FIELD

The present invention relates to a polishing composition.

BACKGROUND ART

In recent years, because of high integration brought about by the microminiaturization of LSI manufacturing processes, computers and other electronic devices have performance improvements, such as downsizing, multifunctionalization, speed enhancement, and the like. In the novel micro-processing technology accompanying such high integration of LSI, a chemical mechanical polishing (CMP) method is used. A CMP method is a technology often used for flattening an interlayer insulating film, metal plug formation, and embedded wiring (damascene wiring) in LSI manufacturing processes, particularly in the multilayer wiring process.

According to a common CMP method, a polishing pad is attached onto a circular polishing table (platen), the polishing pad surface is impregnated with a polishing agent, then the surface of a substrate, which has a metal film formed thereon, is pressed thereagainst, and, in the state where a predetermined pressure (polishing pressure) is applied from the backside, the polishing table is rotated, thereby removing the metal film (e.g., tungsten) by the mechanical friction between the polishing agent and the metal film.

The formation of a metal plug or wiring in a semiconductor device is generally performed as follows. On an insulator layer made of silicon oxide having a recess formed therein, a conductor layer made of a metal, such as one described above, is formed, and then part of the conductor layer on the insulator layer is removed by polishing until the insulator layer is exposed. This polishing process is roughly divided into a main polishing step, in which polishing for removing most of the conductor layer to be removed is performed, and a buffing step, in which the conductor layer and the insulator layer are finish-polished.

A polishing composition used in the semiconductor device manufacturing process generally contains a pH adjusting agent such as an acid, an oxidizing agent, and abrasive grains. Meanwhile, in JP 2012-74734 A (corresponding to U.S. Pat. No. 6,083,419, Description), a polishing composition wherein an etching inhibitor such as an amino acid is further used to inhibit unnecessary etching of an object to be polished, thereby preventing the formation of pits in the surface after polishing, has been reported.

SUMMARY OF INVENTION

However, it has turned out that even when the composition described in JP 2012-74734 A is used, the etching speed on the surface of the object to be polished is still high, resulting in a rough surface after polishing, and sufficient flattening cannot be achieved.

Thus, the present invention has been made in light of the above situation. An object thereof is to provide a polishing composition having a high polishing speed and a low etching speed and capable of achieving sufficient flattening.

The present inventors have conducted extensive research to solve the above problems. As a result, they have found that the above problems can be solved by using a predetermined anticorrosive, and thus accomplished the present invention.

That is, the above object can be achieved by a polishing composition containing
abrasive grains,
an oxidizing agent,
an acid,
an anticorrosive containing a compound represented by the following formula (1) or a salt thereof, and
a dispersing medium.

[Chemical Formula 1]

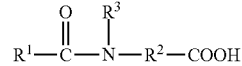

(1)

(In the formula (1), $R^1$ is a linear or branched alkyl group having 6 or more and 30 or less carbon atoms or a linear or branched alkenyl group having 6 or more and 30 or less carbon atoms, $R^2$ is a single bond or an alkylene group having 1 or more and 4 or less carbon atoms, and $R^3$ is a hydrogen atom or a linear or branched alkyl group having 1 or more and 10 or less carbon atoms.)

DESCRIPTION OF EMBODIMENTS

The polishing composition of the present invention contains abrasive grains, an oxidizing agent, an acid, an anticorrosive containing a compound represented by the following formula (1) or a salt thereof, and a dispersing medium.

[Chemical Formula 2]

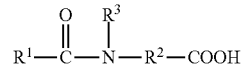

(1)

(In the formula (1), $R^1$ is a linear or branched alkyl group having 6 or more and 30 or less carbon atoms or a linear or branched alkenyl group having 6 or more and 30 or less carbon atoms, $R^2$ is a single bond or an alkylene group having 1 or more and 4 or less carbon atoms, and $R^3$ is a hydrogen atom or a linear or branched alkyl group having 1 or more and 10 or less carbon atoms.)

According to the polishing composition having the above configuration, an object to be polished can be polished at a high polishing speed. At the same time, the etching speed can be suppressed low, and the object to be polished can be polished smooth.

As an example of the performance required for a buffing slurry for a layer containing a metal, the inhibition of surface roughening on the surface of a metal layer after polishing can be mentioned. Among metals, tungsten has been applied to LSI manufacturing processes for its high electrical conductivity and high embeddability. However, it is widely known that tungsten has high hardness and brittleness and thus is difficult to process, and the final finished surface roughness is higher as compared with copper, aluminum, and like metals. In addition to the above, with recent microminiaturization (high integration), the surface roughening of crystal grains of tungsten has become an important issue, and it has been demanded to solve such surface roughening by chemical mechanical polishing (hereinafter sometimes simply referred to as "CMP").

The polishing composition described in JP 2012-74734 A contains, in addition to an acid, an oxidizing agent, and abrasive grains, a metal catalyst for shifting electrons from a metal to an oxidizing agent (iron nitrate etc.) and an etching inhibitor such as an amino acid. Because of the presence of an etching inhibitor such as an amino acid, the etching speed can be suppressed lower than in the case of not using an etching inhibitor.

However, as a result of the research by the present inventors, it has turned out that in the case where polishing is performed using the polishing composition of JP 2012-74734 A, particularly in the case of tungsten, the surface roughness at the crystal interface after polishing increases, and sufficient flattening cannot be achieved. Even in the case where a metal catalyst is not used in the above polishing composition, as a result of using an oxidizing agent and an acid for adjusting the pH of the composition to acidic, the dissolution of a metal occurs, promoting the etching of the metal. Therefore, it is difficult to sufficiently suppress the etching speed even in the case of using an etching inhibitor such as amino acid, and the currently demanded flattening cannot be sufficiently achieved. Therefore, further improvement has been demanded.

In contrast, the present invention is characterized in that a predetermined compound having a long-chain alkyl group or alkenyl group $R^1$ and a carboxyl group (carboxylate) is used as an anticorrosive. According to this configuration, a layer containing a metal (object to be polished having a layer containing a metal) can be polished smooth (to low surface roughness (RMS)). In addition, by using the polishing composition of the present invention, the layer containing a metal (object to be polished having a layer containing a metal) can be polished at a high polishing speed while suppressing the etching speed low. The detailed mechanism of producing the above effects is unknown, but is presumably as follows. Incidentally, the following mechanism is presumption and does not limit the technical scope of the present invention. Usually, the chemical mechanical polishing (CMP) of a layer containing a metal is performed through the following mechanism: An oxidizing agent contained in the polishing composition oxidizes the surface of a layer containing a metal, thereby forming a metal oxide film. This metal oxide film is physically scraped off by abrasive grains, whereby the layer is polished. The polished metal surface is oxidized again with the oxidizing agent to form a metal oxide film, and the metal oxide film is scraped off with abrasive grains; this cycle is repeated. However, the conventional method has been problematic in that the substrate surface after polishing does not have sufficient smoothness. As a result of extensive research about the above problems, the present inventors have surmised that the corrosion at the grain boundary between crystal grains causes a decrease in smoothness. That is, they have surmised as follows. A metal oxide (e.g., tungsten oxide) that has come in contact with water becomes a metal hydroxide (e.g., tungsten hydroxide) and dissolves. Then, because such dissolution caused by a chemical reaction is faster than the scraping by abrasive grains, the etching amount increase, resulting in surface roughening. Here, an increase in the scraping speed of abrasive grains has also been considered as a means for resolution. However, such an increase requires to enhance the abrasive grain concentration and results in high cost, and thus has been judged as poorly practical. Therefore, the present inventors have conducted extensive research about other means for inhibiting the dissolution. As a result, they have come to the idea that it is effective to use a predetermined compound having a long-chain alkyl group or alkenyl group $R^1$ and a carboxyl group (carboxylate) as an anticorrosive. Specifically, the carboxyl group (carboxylate) side of the anticorrosive has high chemical or physical adsorptivity to the surface of an object to be polished, and thus can form a firm protective film on the surface of an object to be polished through a carboxyl group (carboxylate). Further, because of the presence of hydrophobic $R^1$, the surface of the object to be polished becomes hydrophobic, whereby the contact of the oxidizing agent in an aqueous medium with the surface of the object to be polished can be inhibited. As a result, presumably, the dissolution (elution) of a metal (e.g., tungsten) from the substrate at the time of polishing can be inhibited, and the surface roughness after polishing can be reduced.

Therefore, according to the polishing composition of the present invention, a layer containing a metal (object to be polished) can be polished at a high polishing speed while suppressing the etching speed low. In addition, because the elution of a metal can be inhibited, when a layer containing a metal (object to be polished) is polished with the polishing composition of the present invention, the surface roughness (RMS) can be reduced, and a layer having a flat surface (substrate) can be obtained. In addition, according to the polishing composition of the present invention, even without increasing the abrasive grain concentration, a layer containing a metal (object to be polished) can be polished into a flat surface at a high polishing speed while suppressing the etching speed low.

Hereinafter, embodiments of the present invention will be described. Incidentally, the present invention is not limited only to the following embodiments.

As used herein, "X to Y" showing a range means "X or more and Y or less." In addition, as used herein, unless otherwise noted, the operations and the measurement of physical properties and the like are performed under conditions of room temperature (20 to 25° C.)/relative humidity of 40 to 50% RH.

[Object to be Polished]

In the present invention, the object to be polished is not particularly limited, and may be a metal or a layer containing a metal, an object to be polished having an oxygen atom and a silicon atom, an object to be polished having a silicon-silicon bond, an object to be polished having a nitrogen atom and a silicon atom, or the like.

Examples of metals include tungsten, copper, aluminum, cobalt, hafnium, nickel, gold, silver, platinum, palladium, rhodium, ruthenium, iridium, osmium, and the like.

Examples of objects to be polished having an oxygen atom and a silicon atom include silicon oxide ($SiO_2$), tetraethyl orthosilicate (TEOS), and the like.

Examples of objects to be polished having a silicon-silicon bond include polysilicon, amorphous silicon, monocrystalline silicon, n-doped monocrystalline silicon, p-doped monocrystalline silicon, Si-based alloys such as SiGe, and the like.

Examples of objects to be polished having a nitrogen atom and a silicon atom include objects to be polished having a silicon-nitrogen bond, such as a silicon nitride film, SiCN (silicon carbon nitride), and the like.

The object to be polished according to the present invention is preferably a layer containing a metal. That is, the polishing composition of the present invention can be suitably used for polishing an object to be polished having a layer containing a metal. Here, in the layer containing a metal, at least the surface to be polished contains a metal. Therefore, the layer containing a metal may be a substrate made of a metal or may also be a substrate having a layer containing a metal or a layer made of a metal (e.g., a substrate including a layer containing a metal or a layer made of a metal disposed on the substrate made of a polymer or another metal). The layer containing a metal is preferably a layer made of a metal (e.g., substrate) or an object to be polished having a layer made of a metal (e.g., substrate).

Here, the metal is not particularly limited. Examples thereof include tungsten, copper, aluminum, cobalt, hafnium, nickel, gold, silver, platinum, palladium, rhodium, ruthenium, iridium, osmium, and the like. The above metal may be contained in the form of an alloy or a metal compound. These metals may be used alone, and it is also possible to use a combination of two or more kinds. The polishing composition of the present invention can be suitably used for the high integration technology brought about by the microminiaturization of LSI manufacturing processes, and is particularly suitable for use in polishing materials for plugs, via holes, and the like around a transistor. In addition, as materials to be loaded, tungsten, copper, aluminum, and cobalt are preferable, and tungsten is more preferable. That is, according to a particularly preferred mode of the present invention, the metal is tungsten (the polishing composition of the present invention is suitably used for polishing a layer containing tungsten). Further, as tungsten, tungsten deposited by a CVD method and tungsten deposited by an ADL method are particularly preferable.

[Polishing Composition]

The polishing composition of the present invention contains abrasive grains, an oxidizing agent, an acid, a predetermined anticorrosive, and a dispersing medium. Hereinafter, the configuration of the polishing composition of the present invention will be described.

(Abrasive Grains)

The polishing composition of the present invention indispensably contains abrasive grains. The abrasive grains contained in the polishing composition have the action of mechanically polishing an object to be polished and improve the polishing speed of the object to be polished by the polishing composition.

The abrasive grains used may be any of inorganic particles, organic particles, and organic/inorganic composite particles. Specific examples of inorganic particles include particles of metal oxides such as silica, alumina, ceria, and titania, silicon nitride particles, silicon carbide particles, and boron nitride particles. Specific examples of organic particles include polymethyl methacrylate (PMMA) particles. The abrasive grains may be used alone, and it is also possible to use a mixture of two or more kinds. In addition, the abrasive grains used may also be a commercially available product or a synthetic product.

Among these abrasive grains, silica is preferable, and colloidal silica is particularly preferable.

The abrasive grains may be surface-modified. In ordinary colloidal silica, the zeta potential value under acidic conditions is close to zero. Accordingly, under acidic conditions, silica particles do not electrically repel each other and are likely to aggregate. Meanwhile, abrasive grains surface-modified in such a manner that the zeta potential has a relatively large negative value even under acidic conditions strongly repel each other even under acidic conditions and thus are dispersed well. As a result, the storage stability of the polishing composition can be improved. Such surface-modified abrasive grains can be obtained by, for example, mixing a metal such as aluminum, titanium, or zirconium or an oxide thereof with the abrasive grains, and doping the metal or the oxide thereof on the surface of the abrasive grains.

Among them, colloidal silica having an organic acid immobilized thereto is particularly preferable. Immobilization of an organic acid to the surface of colloidal silica contained in the polishing composition is made by, for example, chemical binding of a functional group of the organic acid to the surface of colloidal silica. When colloidal silica and an organic acid simply coexist, immobilization of the organic acid to colloidal silica is not achieved. In the case where sulfonic acid, which is a kind of organic acid, is immobilized to colloidal silica, for example, the method described in "Sulfonic acid-functionalized silica through quantitative oxidation of thiol groups", Chem., Commun., 246-247 (2003), can be employed. Specifically, it is possible that a silane coupling agent having a thiol group, such as 3-mercaptopropyltrimethoxysilane, is coupled to colloidal silica, and then the thiol group is oxidized with hydrogen peroxide, thereby giving colloidal silica having sulfonic acid immobilized to the surface thereof. In the polishing composition of the present invention, in terms of the dispersion stability of the abrasive grains at the designed pH, it is particularly preferable to use colloidal silica having sulfonic acid immobilized to the surface thereof (sulfonic acid-immobilized silica). Alternatively, in the case where carboxylic acid is immobilized to colloidal silica, for example, the method described in "Novel Silane Coupling Agents Containing a Photolabile 2-Nitrobenzyl Ester for Introduction of a Carboxy Group on the Surface of Silica Gel", Chemistry Letters, 3, 228-229 (2000), can be employed. Specifically, a silane coupling agent containing photoactive 2-nitrobenzyl ester is coupled to colloidal silica, followed by irradiation with light, whereby colloidal silica having carboxylic acid immobilized to the surface thereof can be obtained.

The average association degree of the abrasive grains is less than 5.0, for example, more preferably 3.0 or less, and still more preferably 2.5 or less. With a decrease in the average association degree of the abrasive grains, the surface roughness due to the shape of the abrasive grains can be reduced. In addition, the average association degree of the abrasive grains is preferably 1.0 or more, and more preferably 1.05 or more. The average association degree can be determined by dividing the value of the average secondary particle size of the abrasive grains by the value of the average primary particle size. There is an advantageous effect in that with an increase in the average association degree of the abrasive grains, the polishing speed of the object to be polished by the polishing composition improves.

The lower limit of the average primary particle size of the abrasive grains is preferably 10 nm or more, more preferably 15 nm or more, and still more preferably 20 nm or more. In addition, the upper limit of the average primary particle size of the abrasive grains is preferably 200 nm or less, more preferably 150 nm or less, and still more preferably 100 nm or less. Within such a range, the polishing speed of the object to be polished by the polishing composition improves, and also, the occurrence of surface defects on the surface of the object to be polished after polishing using the polishing composition can be suppressed more. Incidentally, the average primary particle size of the abrasive grains is calculated, for example, based on the specific surface area of the abrasive grains measured by a BET method.

The lower limit of the average secondary particle size of the abrasive grains is preferably 15 nm or more, more preferably 20 nm or more, and still more preferably 30 nm or more. In addition, the upper limit of the average secondary particle size of the abrasive grains is preferably 300 nm or less, more preferably 260 nm or less, and still more preferably 220 nm or less. Within such a range, the polishing speed of the object to be polished by the polishing composition improves, and also, the occurrence of surface defects on the surface of the object to be polished after polishing using the polishing composition can be suppressed more. Incidentally, "secondary particles" herein refers to particles formed by abrasive grains gathering in the polishing composition, and the average secondary particle size of the secondary particles can be measured by a dynamic light scattering method, for example.

The upper limit of the aspect ratio of the abrasive grains in the polishing composition is less than 2.0, for example, preferably 1.8 or less, and more preferably 1.5 or less. Within such a range, the surface roughness due to the shape of the abrasive grains can be reduced. Incidentally, an aspect ratio is an average of values obtained by taking a smallest rectangle circumscribed to an image of each abrasive grain particle with a scanning electron microscope and dividing the length of the longer side of the rectangle by the length of the shorter side of the same rectangle, and can be determined using a common image analysis software. The lower limit of the aspect ratio of the abrasive grains in the polishing composition is 1.0 or more. As the aspect ratio approaches this value, the surface roughness due to the shape of the abrasive grains can be reduced more.

In the particle size distribution of the abrasive grains in the polishing composition determined by the laser diffraction/scattering method, the lower limit of the ratio D90/D10 of the particle diameter when the cumulative particle weight reaches 90% of the entire particle weight from the finer particle side (D90) to the particle diameter when it reaches 10% of the entire particle weight of all the particles (D10) is 1.1 or more, for example, preferably 1.2 or more, and more preferably 1.3 or more. In addition, in the particle size distribution of the abrasive grains in the polishing composition determined by the laser diffraction/scattering method, the upper limit of the ratio D90/D10 of the particle diameter when the cumulative particle weight reaches 90% of the entire particle weight from the finer particle side (D90) to the particle diameter when it reaches 10% of the entire particle weight of all the particles (D10) is not particularly set, but is preferably 2.04 or less. Within such a range, the surface roughness due to the shape of the abrasive grains can be reduced.

The lower limit of the content of the abrasive grains in the polishing composition is preferably 0.1 mass % or more, more preferably 0.5 mass % or more, and most preferably 1 mass % or more. In addition, the upper limit of the content of the abrasive grains in the polishing composition is preferably 50 mass % or less, more preferably 30 mass % or less, and still more preferably 20 mass % or less. Within such a range, the polishing speed of the object to be polished improves. In addition, the cost of the polishing composition can be suppressed, and the occurrence of surface defects on the surface of the object to be polished after polishing using the polishing composition can be suppressed more.

(Acid)

In order to adjust the pH of the polishing composition to a desired value, the polishing composition of the present invention indispensably contains an acid. Incidentally, as used herein, the compound represented by the formula (1) or salt thereof to serve as an anticorrosive is treated as different from the acid to serve a pH adjusting agent.

The acid is not particularly limited, and may be any of inorganic acids and organic acids. Examples of organic acids include carboxylic acids such as formic acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, isophthalic acid, terephthalic acid, gallic acid, mellitic acid, cinnamic acid, fumaric acid, maleic acid, aconitic acid, nitrocarboxylic acid, citric acid, succinic acid, malonic acid, tartaric acid, lactic acid, malic acid, acetic acid, phthalic acid, glycolic acid, crotonic acid, valeric acid, 2-hydroxybutyric acid, γ-hydroxybutyric acid, 2-hydroxyisobutyric acid, 3-hydroxyisobutyric acid, glyceric acid, benzoic acid, leucic acid, propionic acid, butanoic acid, 2-methylbutanoic acid, n-hexanoic acid, 3,3-dimethylbutanoic acid, 2-ethylbutanoic acid, 4-methylpentanoic acid, n-heptanoic acid, 2-methylhexanoic acid, n-octanoic acid, 2-ethylhexanoic acid, salicylic acid, oxalic acid, glutaric acid, adipic acid, pimelic acid, and mandelic acid, and sulfonic acids such as methanesulfonic acid, ethanesulfonic acid, benzenesulfonic acid, p-toluenesulfonic acid, 10-camphorsulfonic acid, isethionic acid, and taurine. Examples also include inorganic acids such as carbonic acid, hydrochloric acid, nitric acid, phosphoric acid, phosphinic acid, phosphorous acid, phosphonic acid, sulfuric acid, boric acid, hydrofluoric acid, orthophosphoric acid, pyrophosphoric acid, polyphosphoric acid, metaphosphoric acid, and hexametaphosphoric acid. These acids may be used alone, and it is also possible to use a mixture of two or more kinds.

In terms of the metal dissolution inhibiting ability, an organic acid having a carboxyl group and an organic acid having a carboxyl group and a terminal hydroxy group (i.e., —$CH_2OH$) are preferable.

The amount of acid added is not particularly limited, and an amount that makes a desired pH range is suitably selected.

The polishing composition of the present invention preferably contains an acid having an acid dissociation constant (pKa) that is higher than the pH of the composition. Incidentally, as used herein, "acid dissociation constant (pKa)" is sometimes simply referred to as "acid dissociation constant" or "pKa." The acid according to the present invention acts as an anticorrosive. Therefore, because of the presence of the acid according to the present invention, the dissolution (elution) of a metal to be polished can be suppressed, and the layer containing a metal (object to be polished) can be polished smooth (to low surface roughness (RMS)). In addition, the layer containing a metal (object to be polished) can be polished at a high polishing speed while suppressing the etching speed low.

As used herein, the acid dissociation constant (pKa) of an acid is an index of acidity, and is the common logarithm of the reciprocal of the dissociation constant of acid (Ka). That is, under dilute aqueous solution conditions, the acid dissociation constant $Ka=[H_3O^-][B^-]/[BH]$ is measured, and the acid dissociation constant (pKa) of the acid is determined from pKa=−log Ka. Incidentally, in the above equation, BH represents an organic acid, and $B^-$ represents a conjugate base of the organic acid. As the pKa measurement method, the hydrogen ion concentration is measured using a pH meter, and the pKa can be calculated from the concentration of the substance and the hydrogen ion concentration. Incidentally, in the case of a polybasic acid, the value is determined with respect to Ka for the first stage (pKa1).

Here, the difference between the pH of the polishing composition and the acid dissociation constant of the acid is not particularly limited. However, considering further improvement in the inhibiting effect on metal dissolution (elution), the difference between the acid dissociation constant of the acid (pKa) and the pH of the composition [=(the acid dissociation constant of the acid (pKa))−(the pH of the composition)] is 0.7 or more, for example, preferably 0.9 or more, more preferably 1.0 or more, more preferably 1.2 or more, and particularly preferably more than 1.4. An acid that satisfies such a difference can more effectively inhibit the dissolution (elution) of a metal from the substrate at the time of polishing, and further reduce the surface roughness of the layer containing a metal (object to be polished) after polishing. In addition, when the polishing composition used contains such an acid, the etching speed at the time of polishing can be reduced more while maintaining the polishing speed high.

Here, the pKa of the acid is not particularly limited, and can be suitably selected according to the kind of metal to be polished. Specifically, the acid dissociation constant (pKa) of the acid is preferably 2.9 or more and less than 5.0, more preferably more than 3.0 and 4.9 or less, still more preferably 3.2 or more and 4.8 or less, and particularly preferably more than 3.4 and 4.8 or less. An acid having such pKa can more effectively inhibit the dissolution (elution) of a metal from the substrate at the time of polishing, and further reduce the surface roughness of the layer containing a metal (object to be polished) after polishing. In addition, when the polishing composition used contains such an acid, the etching speed at the time of polishing can be reduced more while maintaining the polishing speed high.

Examples of acids having an acid dissociation constant (pKa) of 2.9 or more and less than 5.0 include citric acid, succinic acid, tartaric acid, lactic acid, malic acid, acetic acid, phthalic acid, glycolic acid, crotonic acid, valeric acid, 2-hydroxybutyric acid, γ-hydroxybutyric acid, 2-hydroxyisobutyric acid, 3-hydroxyisobutyric acid, glyceric acid, benzoic acid, leucic acid, and the like. Among them, succinic acid, lactic acid, phthalic acid, glycolic acid, crotonic acid, valeric acid, γ-hydroxybutyric acid, 2-hydroxyisobutyric acid, 3-hydroxyisobutyric acid, and benzoic acid are preferable, and 2-hydroxyisobutyric acid is particularly preferable. Such an acid can more effectively inhibit the dissolution (elution) of a metal from the substrate at the time of polishing, and further reduce the surface roughness of the layer containing a metal (object to be polished) after polishing. In addition, when the polishing composition used contains such an acid, the etching speed at the time of polishing can be reduced more while maintaining the polishing speed high.

The above acids may be used alone or may also be used in the form of a mixture of two or more kinds. Incidentally, in the case of using two or more kinds of acids, the acid dissociation constants (pKa) of the acids can be measured by the above method.

The content of the acid in the polishing composition is not particularly limited, but is preferably an amount that makes a polishing composition pH of 1 or more and 7 or less, more preferably 1.05 or more and 5 or less, still more preferably 1.3 or more and 4 or less, particularly preferably 1.5 or more and 3.5 or less. A polishing composition having such a pH has excellent storage stability. In addition, such a polishing composition is easy to handle. In addition, the polishing speed of the metal, which is the object to be polished, can be improved.

(Oxidizing Agent)

In addition to the above abrasive grains and acid, the polishing composition of the present invention indispensably contains an oxidizing agent. The oxidizing agent according to the present invention is not particularly limited, but is preferably a peroxide. That is, according to a preferred mode of the present invention, the oxidizing agent is a peroxide. Specific examples of such peroxides include, but are not limited to, hydrogen peroxide, peracetic acid, percarbonate, urea peroxide, sodium persulfate, potassium persulfate, ammonium persulfate, potassium peroxymonosulfate, Oxone, and the like. The above oxidizing agents may be used alone, and it is also possible to use a mixture of two or more kinds. That is, according to a preferred mode of the present invention, the peroxide is at least one selected from the group consisting of hydrogen peroxide, peracetic acid, percarbonate, urea peroxide, sodium persulfate, potassium persulfate, ammonium persulfate, potassium peroxymonosulfate, and Oxone. The oxidizing agent is more preferably a persulfate (sodium persulfate, potassium persulfate, ammonium persulfate) or hydrogen peroxide, and particularly preferably hydrogen peroxide.

The lower limit of the content (concentration) of the oxidizing agent in the polishing composition is preferably 0.001 mass % or more, more preferably 0.005 mass % or more, and still more preferably 0.01 mass % or more. There is an advantage in that with an increase in the content of the oxidizing agent, the polishing speed by the polishing composition improves. In addition, the upper limit of the content (concentration) of the oxidizing agent in the polishing composition is preferably 10 mass % or less, more preferably 5 mass % or less, and still more preferably 1 mass % or less. There is an advantage in that with a decrease in the content of the oxidizing agent, the material cost of the polishing composition can be suppressed. In addition, the load of disposing the polishing composition after use for polishing, that is, waste water treatment, can be reduced. In addition, there also is an advantage in which excessive oxidation of the surface of the object to be polished is less likely to occur, and the roughness of the metal surface after polishing is reduced.

Incidentally, an oxidizing agent forms an oxide film on the surface of the layer containing a metal. Therefore, the oxidizing agent is preferably added immediately before polishing.

(Anticorrosive)

An anticorrosive prevents the dissolution of a metal, thereby acting to suppress the deterioration of surface conditions, such as surface roughening on the polished surface. The polishing composition of the present invention contains a compound represented by the following formula (1) or a salt thereof.

[Chemical Formula 3]

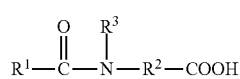

(1)

In the formula (1), $R^1$ is a linear or branched alkyl group having 6 or more and 30 or less carbon atoms or a linear or branched alkenyl group having 6 or more and 30 or less carbon atoms, $R^2$ is a single bond or an alkylene group having 1 or more and 4 or less carbon atoms, and $R^3$ is a hydrogen atom or a linear or branched alkyl group having 1 or more and 10 or less carbon atoms.

In the formula (1), $R^2$ is a linear or branched alkyl group having 6 or more and 30 or less carbon atoms or a linear or branched alkenyl group having 6 or more and 30 or less carbon atoms. When the number of carbon atoms in $R^2$ is 5 or less, the surface of the object to be polished is less likely to be sufficiently hydrophobized. Accordingly, the surface easily comes in contact with water or an oxidizing agent, and sufficient anticorrosiveness is not obtained. As a result, the etching resistance decreases, resulting in insufficient smoothness after polishing. Meanwhile, when the number of carbon atoms in $R^2$ is more than 30, the water solubility decreases, and thus the dispersion stability of the compound of the formula (1) may decrease. $R^2$ is preferably a linear or branched alkyl group having 10 or more and 20 or less carbon atoms or a linear or branched alkenyl group having 10 or more and 20 or less carbon atoms, more preferably a linear or branched alkyl group having 11 or more and 18 or less carbon atoms or a linear or branched alkenyl group having 11 or more and 18 or less carbon atoms, and still more preferably a linear or branched alkyl group having 13 or more and 18 or less carbon atoms or a linear or branched alkenyl group having 13 or more and 18 or less carbon atoms. These groups may have a substituent.

Specifically, the alkyl group having 6 or more and 30 or less carbon atoms may be linear or branched, and examples thereof include a hexyl group, a heptyl group, an octyl group, a nonyl group, a decyl group, an undecyl group, a dodecyl group, a tridecyl group, a tetradecyl group, a pentadecyl group, a hexadecyl group (cetyl group), a heptadecyl group, an octadecyl group (stearyl group), a nonadecyl group, an icosyl group, an eicosyl group, a henicosyl group, a heneicosyl group, a docosyl group, a tricosyl group, a tetracosyl group, a pentacosyl group, a hexacosyl group, a heptacosyl group, an octacosyl group, a nonacosyl group, an isohexyl group, a 2-ethylhexyl group, and the like. Among them, a decyl group, an undecyl group, and a dodecyl group are preferable.

Examples of linear or branched alkenyl groups having 6 or more and 30 or less carbon atoms include a hexenyl group, a heptenyl group, an octenyl group, a nonenyl group, a decenyl group, an undecenyl group, a dodecenyl group, a tridecenyl group, a tetradecenyl group, a pentadecenyl group, a hexadecenyl group, a heptadecenyl group, an octadecenyl group, an octadecatrienyl group, a (5Z,8Z,11Z,14Z)-nonadeca-5,8,11,14-tetraenyl group, an icosenyl group, a henicosenyl group, a docosenyl group, a triacontenyl group, and the like. Among them, a nonenyl group, a decenyl group, an undecenyl group, and a dodecenyl group are preferable.

The substituents are not particularly limited, and examples thereof include a halogen atom (a fluorine atom, a chlorine atom, a bromine atom, or an iodine atom), a hydroxyl group, a nitro group, a carbonyl group, and the like.

In the formula (1), $R^2$ is a single bond or an alkylene group having 1 or more and 4 or less carbon atoms. Examples of alkylene groups having 1 or more and 4 or less carbon atoms include a methylene group, an ethylene group, an n-propylene group, an n-butylene group, a trimethylene group, a tetramethylene group, and the like. $R^2$ is preferably a methylene group or an ethylene group. The alkylene groups having 1 or more and 4 or less carbon atoms may be substituted, and, as substituents, those same as above can be used.

In the formula (1), $R^3$ is a hydrogen atom or a linear or branched alkyl group having 1 or more and 10 or less carbon atoms. Examples of linear or branched alkyl groups having 1 or more and 10 or less carbon atoms include a methyl group, an ethyl group, a propyl group, an isopropyl group, a butyl group, an isobutyl group, a sec-butyl group, a tert-butyl group, a pentyl group, an isopentyl group, a tert-pentyl group, a neopentyl group, a hexyl group, a heptyl group, an octyl group, an isohexyl group, a 2-ethylhexyl group, and the like. $R^3$ is preferably a linear or branched alkyl group having 1 or more and 10 or less carbon atoms, more preferably an alkyl group having 1 or more and 3 or less carbon atoms, and particularly preferably a methyl group. The alkyl groups having 1 or more and 10 or less carbon atoms may be substituted, and, as substituents, those same as above can be used.

Salts of compounds represented by the above formula (1) are not particularly limited, and examples thereof include alkali metal salts such as a sodium salt and a potassium salt, salts of Group II elements such as a calcium salt, an amine salt, an ammonium salt, and the like. Among them, an ammonium salt is preferable.

Specific examples of compounds represented by the above formula (1) or salts thereof include N-nonanoyl-N-methyl-β-alanine, N-decanoyl-N-methyl-β-alanine, N-undecanoyl-N-methyl-β-alanine, N-lauroyl-N-methyl-β-alanine, N-myristoyl-N-methyl-β-alanine, and N-nonadecanoyl-N-methyl-β-alanine, as well as salts thereof. Compounds represented by the above formula (1) or salts thereof may be used alone, and it is also possible to use a combination of two or more kinds.

The content (concentration) of the compound represented by the formula (1) or salt thereof, which serves as an anticorrosive, in the polishing composition is not particularly limited. For example, the lower limit of the content (concentration) of the anticorrosive is preferably 0.01 mmol % or more, more preferably 0.1 mmol % or more, and still more preferably 1.0 mmol % or more relative to the final polishing composition. Within such a range, the dissolution of a metal can be prevented, and the deterioration of the surface conditions, such as surface roughening on the polished surface, can be suppressed. In addition, the upper limit of the content (concentration) of the anticorrosive is preferably 1000 mmol % or less, more preferably 500 mmol % or less, and still more preferably 50 mmol % or less. With such a range, an excellent polishing speed can be obtained. In the case where a combination of two or more kinds of compounds represented by the formula (1) or salts thereof is used, it is preferable that their total content is within the above range.

(Dispersing Medium)

The polishing composition of the present invention contains a dispersing medium in order to disperse or dissolve each component. Here, the dispersing medium is not particularly limited, but is preferably water. In terms of inhibiting the blocking of the actions of other components, water containing as little impurities as possible is more preferable. Specifically, pure water or ultrapure water, obtained by removing impurity ions with an ion exchange resin, and then removing foreign bodies through a filter, or distilled water is preferable.

(Other Components)

As described above, the polishing composition of the present invention indispensably contains abrasive grains, an acid, an oxidizing agent, a predetermined anticorrosive, and a dispersing medium, but may also contain other additives in addition to the above components. Here, other additives are not particularly limited, and additives usually added to the polishing composition can be used. Specific examples thereof include complexing agents, metal anticorrosives other than the anticorrosive that is a compound represented by the above formula (1) or a salt thereof, antiseptic agents, antifungal agents, reducing agents, water-soluble polymers, organic solvents for dissolving a poorly soluble organic matter, and the like. Incidentally, the polishing composition of the present invention does not substantially contain the di-quaternary compound described in JP 2013-42131 A, for example. In addition, the polishing composition of the present invention does not substantially contain an iodine compound (e.g., potassium iodate) that may serve as a trigger of iodine gas generation. Here, "not substantially contain" means that the target substance is present in a proportion of 10 mass % or less (lower limit: 0 mass %) relative to the polishing composition, and the proportion is preferably 5 mass % or less (lower limit: 0 mass %).

Hereinafter, of the other additives described above, complexing agents, metal anticorrosives other than the compound represented by the formula (1) or salt thereof, antiseptic agents, and antifungal agents will be described.

A complexing agent that may be contained in the polishing composition as necessary has the action of chemically etching the surface of an object to be polished and more effectively improves the polishing speed of the object to be polished by the polishing composition.

Examples of usable complexing agents include an inorganic acid or a salt thereof, an organic acid or a salt thereof, a nitrile compound, a chelating agent, and the like. These complexing agents may be used alone, and it is also possible to use a mixture of two or more kinds. In addition, the complexing agent used may also be a commercially available product or a synthetic product.

As the complexing agent, a salt of the inorganic acid or organic acid described above may be used. In particular, in the case where a salt of a weak acid and a strong base, a salt of a strong acid and a weak base, or a salt of a weak acid and a weak base is used, the pH buffering action can be expected. Examples of such salts include potassium chloride, sodium sulfate, potassium nitrate, potassium carbonate, potassium tetrafluoroborate, potassium pyrophosphate, potassium oxalate, trisodium citrate, (+)-potassium tartrate, potassium hexafluorophosphate, and the like.

Specific examples of nitrile compounds include acetonitrile, aminoacetonitrile, propionitrile, butyronitrile, isobutyronitrile, benzonitrile, glutarodinitrile, methoxyacetonitrile, and the like.

Specific examples of chelating agents include nitrilotriacetic acid, diethylenetriaminepentaacetic acid, ethylenediaminetetraacetic acid, N, N, N-trimethylenephosphonic acid, ethylenediamine-N,N,N',N'-tetramethylenesulfonic acid, trans-cyclohexanediaminetetraacetic acid, 1,2-diaminopropanetetraacetic acid, glycol ether diamine tetraacetic acid, ethylenediamineorthohydroxyphenylacetic acid, ethylenediaminedisuccinic acid (SS-form), N-(2-carboxylate ethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl) ethylenediamine-N,N'-diacetic acid, 1,2-dihydroxybenzene-4,6-disulfone acid, and the like.

Among them, at least one member selected from the group consisting of an inorganic acid or a salt thereof, a carboxylic acid or a salt thereof, and a nitrile compound is preferable. In terms of the stability of the complex structure with the metal compound contained in the object to be polished, an inorganic acid or a salt thereof is more preferable.

In the case where the polishing composition contains a complexing agent, the content (concentration) of the complexing agent is not particularly limited. For example, the lower limit of the content (concentration) of the complexing agent is not particularly limited as the effect can be exerted even in a small amount, but is preferably 0.001 g/L or more, more preferably 0.01 g/L or more, and still more preferably 1 g/L or more. In addition, the upper limit of the content (concentration) of the complexing agent is preferably 20 g/L or less, more preferably 15 g/L or less, and still more preferably 10 g/L or less. Within such a range, the polishing speed of the object to be polished improves, and this is also advantageous in improving the smoothness of the surface of the object to be polished after polishing using the polishing composition.

Next, the metal anticorrosive other than the compound represented by the formula (1) or salt thereof is not particularly limited, but is preferably a heterocyclic compound or a surfactant. The number of members in a heterocyclic ring in a heterocyclic compound is not particularly limited. In addition, the heterocyclic compound may be a monocyclic compound or may also be a polycyclic compound having a condensed ring. The metal anticorrosives may be used alone, and it is also possible to use a mixture of two or more kinds. In addition, the metal anticorrosive used may also be a commercially available product or a synthetic product.

Specific examples of heterocyclic compounds usable as metal anticorrosives other than the compound represented by the formula (1) or a salt thereof include nitrogen-containing heterocyclic compounds such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buterizine compound, a thiazole compound, an isothiazole compound, an oxazol compound, an isoxazole compound, and a furazan compound.

More specifically, examples of pyrazole compounds include 1H-pyrazole, 4-nitro-3-pyrazolecarboxylic acid, 3,5-pyrazolecarboxylic acid, 3-amino-5-phenylpyrazole, 5-amino-3-phenylpyrazole, 3,4,5-tribromopyrazole, 3-aminopyrazole, 3,5-dimethylpyrazole, 3,5-dimethyl-1-hydroxymethylpyrazole, 3-methylpyrazole, 1-methylpyrazole, 3-amino-5-methylpyrazole, 4-amino-pyrazolo[3,4-d]pyrimidine, allopurinol, 4-chloro-1H-pyrazolo[3,4-D]pyrimidine, 3,4-dihydroxy-6-methyl-pyrazolo(3,4-B)-pyridine, 6-methyl-1H-pyrazolo[3,4-b]pyridin-3-amine, and the like.

Examples of imidazole compounds include imidazole, 1-methyl-imidazole, 2-methyl-imidazole, 4-methyl-imidazole, 1,2-dimethylpyrazole, 2-ethyl-4-methyl-imidazole, 2-isopropylimidazole, benzimidazole, 5,6-dimethylbenzimidazole, 2-aminobenzimidazole, 2-chlorobenzimidazole, 2-methyl-benzimidazole, 2-(1-hydroxyethyl)benzimidazole, 2-hydroxybenzimidazole, 2-phenylbenzimidazole, 2,5-dimethylbenzimidazole, 5-methyl-benzimidazole, 5-nitrobenzimidazole, and the like.

Examples of triazole compounds include 1,2,3-triazole (1H-BTA), 1,2,4-triazole, 1-methyl-1,2,4-triazole, methyl-1H-1,2,4-triazole-3-carboxylate, 1,2,4-triazole-3-carboxylic acid, 1,2,4-triazole-3-methyl carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazol-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5-methyl-1H-benzotriazole, 5,6-dimethyl-1H-benzotriazole, 1-(1',2'-dicarboxyethyl)benzotriazole, 1-[N,N-bis(hydroxyethyl)aminomethyl]benzotriazole, 1-[N,N-bis(hydroxyethyl)aminomethyl]-5-methylbenzotriazole, 1-[N,N-bis(hydroxyethyl)aminomethyl]-4-methylbenzotriazole, and the like.

Examples of tetrazole compounds include 1H-tetrazole, 5-methyl-tetrazole, 5-aminotetrazole, 5-phenyltetrazole, and the like.

Examples of indazole compounds include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, 3-carboxy-5-methyl-1H-indazole, and the like.

Examples of indole compounds include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, 5-chloro-2-methyl-1H-indole, and the like.

Among them, the heterocyclic compound is preferably a triazole compound. In particular, 1H-benzotriazole, 5-methyl-1H-benzotriazole, 5,6-dimethyl-1H-benzotriazole, 1-[N,N-bis(hydroxyethyl)aminomethyl]-5-methylbenzotriazole, 1-[N,N-bis(hydroxyethyl)aminomethyl]-4-methylbenzotriazole, 1,2,3-triazole, and 1,2,4-triazole are preferable. These heterocyclic compounds have high chemical or physical adsorptivity to the surface of an object to be polished, and thus can form a firmer protective film on the surface of an object to be polished. This is advantageous in improving the smoothness of the surface of the object to be polished after polishing using the polishing composition of the present invention.

In addition, examples of surfactants for use as a metal anticorrosive other than the compound represented by the formula (1) or salt thereof include anionic surfactants, cationic surfactants, and amphoteric surfactants other than the compound represented by the formula (1) or salt thereof.

Examples of anionic surfactants include a polyoxyethylene alkyl ether acetic acid, a polyoxyethylene alkyl sulfate, an alkyl sulfate ester, a polyoxyethylene alkyl ether sulfuric acid, an alkyl ether sulfuric acid, an alkylbenzene sulfonic acid, an alkyl phosphate ester, a polyoxyethylene alkyl phosphate ester, polyoxyethylene sulfosuccinic acid, an alkyl sulfosuccinic acid, an alkylnaphthalene sulfonic acid, an alkyl diphenyl ether disulfonic acid, salts thereof, and the like.

Examples of cationic surfactants include an alkyltrimethyl ammonium salt, an alkyldimethyl ammonium salt, an alkylbenzyl dimethylammonium salt, an alkylamine salt, and the like.

Examples of amphoteric surfactants include an alkyl betaine, an alkylamine oxide and the like.

Specific examples of nonionic surfactants include a polyoxyalkylene alkyl ether such as a polyoxyethylene alkyl ether, a sorbitan fatty acid ester, a glycerine fatty acid ester, a polyoxyethylene fatty acid ester, a polyoxyethylene alkylamine, and an alkylalkanolamide. Among them, a polyoxyalkylene alkyl ether is preferable.

Preferred surfactants among them are a polyoxyethylene alkyl ether acetic acid, a polyoxyethylene alkyl ether sulfate, an alkyl ether sulfate, and an alkylbenzene sulfonate. These surfactants have high chemical or physical adsorptivity to the surface of an object to be polished, and thus can form a firmer protective film on the surface of an object to be polished. This is advantageous in improving the flatness of the surface of the object to be polished after polishing using the polishing composition of the present invention.

In the case where the polishing composition contains a metal anticorrosive other than the compound represented by the formula (1) or salt thereof, the content (concentration) of the metal anticorrosive other than the compound represented by the formula (1) or salt thereof is not particularly limited. For example, the lower limit of the content (concentration) of the metal anticorrosive other than the compound represented by the formula (1) or salt thereof is preferably 0.0005 mmol % or more, more preferably 0.001 mmol % or more, and still more preferably 0.005 mmol % or more relative to the final polishing composition. In addition, the upper limit of the metal anticorrosive content (concentration) is preferably 10 mmol % or less, more preferably 5 mmol % or less, and still more preferably 1 mmol % or less. Within such a range, the dissolution of a metal can be prevented, and the deterioration of the surface conditions, such as surface roughening on the polished surface, can be suppressed.

Further, examples of antiseptic agents and antifungal agents that may be contained in the polishing composition as necessary include isothiazoline-based antiseptic agents such as 2-methyl-4-isothiazolin-3-one and 5-chloro-2-methyl-4-isothiazolin-3-one, p-hydroxybenzoate esters, phenoxyethanol, and the like. These antiseptic agents and antifungal agents may be used alone, and it is also possible to use a mixture of two or more kinds.

[Method for Producing Polishing Composition]

The method for producing the polishing composition of the present invention is not particularly limited. For example, the polishing composition can be obtained by stir-mixing abrasive grains, an acid, an oxidizing agent, and a predetermined anticorrosive, together with other components as necessary, in a dispersing medium (e.g., water). The details of the components are as described above. Therefore, the present invention provides a method for producing the polishing composition of the present invention, including mixing the abrasive grains, the oxidizing agent, the acid, the anticorrosive, and the dispersing medium. Incidentally, as described above, an oxidizing agent promotes the formation of an oxidized film on the surface of a layer containing a metal. Therefore, it is preferable that the abrasive grains, the acid, and the anticorrosive, as well as other components as necessary, are first added to a dispersing medium (e.g., water) to prepare a preliminary composition, and an oxidizing agent is added to the preliminary composition immediately before polishing.

The temperature at the time of mixing the components is not particularly limited, but is preferably 10° C. to 40° C., and it is also possible to perform heating in order to increase the rate of dissolution. In addition, as long as homogenous mixing can be achieved, the mixing time is not particularly limited either.

[Polishing Method and Method for Producing Substrate]

As described above, the polishing composition of the present invention is suitable for use in polishing a layer containing a metal (object to be polished). Therefore, the present invention also provides a polishing method for polishing an object to be polished having a layer containing a metal with the polishing composition of the present invention. In addition, the present invention provides a method for producing a substrate, including a step of polishing a layer containing a metal (object to be polished) with the polishing method.

As the polishing device, a common polishing device having attached thereto a holder for holding a substrate having the object to be polished or the like, a motor capable of changing the rotation speed, and the like, and including a polishing table to which a polishing pad (polishing cloth) can be attached, can be used.

As the polishing pad, common nonwoven fabrics, polyurethane, porous fluororesin, and the like can be used without particular limitations. It is preferable that the polishing pad has formed therein grooves, in which the polishing compound accumulates.

With respect to the polishing conditions, for example, the rotation speed of the polishing table is preferably 10 to 500 rpm. The pressure applied to the substrate having the object to be polished (polishing pressure) is preferably 0.5 to 10 psi. The method for supplying a polishing composition to the polishing pad is not particularly limited either, and a continuous supply method using a pump or the like may be employed, for example. The supply amount is not limited, but it is preferable that the surface of the polishing pad is constantly covered with the polishing composition of the present invention.

After polishing, the substrate is washed in running water and then dried by flicking off water droplets adhering onto the substrate using a spin dryer or the like, whereby a substrate having a layer containing a metal is obtained.

The polishing composition of the present invention may be a one-component type or may also be a multi-component type such as a two-component type. As described above, an oxidizing agent promotes the formation of an oxidized film on the surface of a layer containing a metal. Therefore, it is preferable that the composition is a two-component type including a first liquid containing abrasive grains, an acid, a dispersing medium (for example, water), and other additives as necessary and a second liquid containing an oxidizing agent and a dispersing medium (for example, water) as necessary. In addition, the polishing composition of the present invention may be prepared by diluting a stock solution of the polishing composition by a factor of 10 or greater with a diluent such as water, for example.

The polishing composition of the present invention is preferably used in the metal polishing process, particularly in the tungsten polishing process. Further, when the tungsten polishing process is roughly divided into a main polishing step, which is performed to remove most of the tungsten-containing layer, and a buffing step, in which the tungsten-containing layer and the insulator layer are finish-polished, the polishing composition of the present invention is preferably used in the buffing step.

EXAMPLES

The present invention will be described in further detail using the following examples and comparative examples. However, the technical scope of the present invention is not limited only to the following examples. Incidentally, unless otherwise noted, "%" and "parts" mean "% by mass" and "parts by mass", respectively. In addition, in the following Examples, unless otherwise noted, the operations were performed under conditions of room temperature (25° C.)/relative humidity 40 to 50% RH.

Example 1

(Preparation of Polishing Composition)

To 1 L of pure water, N-nonanoyl-N-methyl-β-alanine in an amount of 10 mmol % relative to the final polishing composition, 2-hydroxyisobutyric acid in an amount of 4.0 mass % relative to the final polishing composition, and abrasive grains (sulfonic acid-immobilized colloidal silica; average primary particle size: 30 nm, average secondary particle size: 60 nm, aspect ratio: 1.24, D90/D10:2.01) in an amount of 2.0 mass % relative to the final polishing composition were added to prepare each preliminary composition. In addition, immediately before polishing a tungsten wafer, a hydrogen peroxide solution (30 mass %) as an oxidizing agent was added to the above preliminary composition with stirring in an amount to make a hydrogen peroxide content of 0.2 mass % relative to the final polishing composition. Incidentally, the pH of the polishing composition (liquid temperature: 25° C.) was checked with a pH meter (manufactured by HORIBA, Ltd., Model No.: LAQUA).

Examples 2 to 8 and Comparative Examples 1 to 10

(Preparation of Polishing Composition)

Polishing compositions of examples and comparative examples were prepared in the same manner as in Example 1, except that the kind and content of each component were changed as shown in Tables 1 to 3 below.

With respect to each of the polishing compositions obtained above, the polishing speed (Removal Rate) (A/min), the etching amount (A/20 min) when immersed at 60° C. for 20 minutes, and the surface roughness (RMS) were evaluated by the following methods. The results are collectively shown in Tables 1 to 3 below.

<Measurement of Polishing Speed (Removal Rate)>

The object to be polished was polished using each polishing composition under the following polishing conditions. The thickness of the object to be polished (film thickness) before and after polishing was measured with a manual sheet resistor (VR-120, manufactured by Hitachi Kokusai Electric Inc.). In accordance with the following (Polishing Speed Calculation Method), the difference in the thickness of the object to be polished (film thickness) before and after polishing was divided by the polishing time to determine the polishing speed (Removal Rate) (A/min). Incidentally, as an object to be polished, a tungsten wafer deposited by a CVD method (size: 32 mm×32 mm) was used.

(Polishing Conditions)

Polishing machine: One-side CMP polishing machine (ENGIS)

Polishing pad: Pad made of polyurethane (IC 1010: manufactured by Rohm and Haas Company)

Pressure: 2.0 psi

Platen (table) rotation speed: 70 rpm

Head (carrier) rotation speed: 70 rpm

Polishing composition flow rate: 150 ml/min

Polishing time: 60 sec.

(Polishing Speed Calculation Method)

The polishing speed (polishing rate) (Å/min) is calculated by the following equation (1).

[Mathematical Formula 1]

$$\text{Polishing speed (Å/min)} = \frac{[\text{Film thickness of object to be polished before polishing(Å)}] - [\text{Film thickness of object to be polished after polishing(Å)}]}{[\text{Polishing time (min)}]} \quad \text{Equation (1)}$$

<Measurement of Etching Amount>

An etching test was performed by the following operation. That is, a sample solution obtained by stirring 300 mL of each polishing composition at 300 rpm was heated to 60° C. in an oil bath and maintained, and then an object to be polished was immersed therein for 20 minutes. After immersion, the object to be polished was washed with pure water for 30 seconds and then dried by air-blow drying with an air gun. The thickness of the object to be polished (film thickness) before and after the etching test was measured with a manual sheet resistor (VR-120, manufactured by Hitachi Kokusai Electric Inc.). In accordance with the following (Etching Amount Calculation Method), the difference in the thickness of the object to be polished (film thickness) before and after the etching test was measured to determine the etching amount (Å/20 min). Incidentally, as an object to be polished, a tungsten wafer deposited by a CVD method (size: 32 mm×32 mm) was used.

(Etching Amount Calculation Method)

The etching amount (Å/20 min) is calculated by the following equation (2).

[Mathematical Formula 2]

$$\text{Etching amount (Å/20 min)} = [\text{Film thickness of object to be polished before etching test (Å)}] - [\text{Film thickness of object to be polished after etching test (Å)}] \quad \text{Equation (2):}$$

<Measurement of Surface Roughness (RMS)>

In the same manner as in the above <Measurement of Polishing Speed (Removal Rate)>, an object to be polished was polished using the polishing composition. The surface roughness (RMS) on the polished surface of the object to be polished after polishing was measured using a scanning probe microscopy (SPM). Incidentally, as SPM, NANO-NAVI2 manufactured by Hitachi High-Technologies Corporation was used. SI-DF40P2 was used as the cantilever. The measurement was performed three times at a scanning frequency of 0.86 Hz, X: 512 pt, and Y: 512 pt, and their average was defined as the surface roughness (RMS).

TABLE 1

| | Acid | | | Anticorrosive | | | | | Etching amount (Å/20 min) | Polishing speed (Å/min) | Surface roughness (Å) |
|---|---|---|---|---|---|---|---|---|---|---|---|
| | Kind | pKa | Concentration (mass %) | Kind | $R^1$ | $R^2$ | $R^3$ | pH | | | |
| Example 1 | 2-Hydroxyisobutyric acid | 4.4 | 4.0 | N-Nonanoyl-N-methyl-β-alanine | $C_8H_{17}$ | $C_2H_4$ | $CH_3$ | 2.1 | 8.8 | 128 | 5.6 |
| Example 2 | 2-Hydroxyisobutyric acid | 4.4 | 4.0 | N-Undecanoyl-N-methyl-β-alanine | $C_{10}H_{21}$ | $C_2H_4$ | $CH_3$ | 2.1 | 4.0 | 122 | 5.5 |
| Example 3 | 2-Hydroxyisobutyric acid | 4.4 | 4.0 | N-Lauroyl-N-methyl-β-alanine | $C_{11}H_{23}$ | $C_2H_4$ | $CH_3$ | 2.1 | 2.2 | 118 | 5.7 |
| Example 4 | 2-Hydroxyisobutyric acid | 4.4 | 4.0 | N-Myristoyl-N-methyl-β-alanine | $C_{13}H_{27}$ | $C_2H_4$ | $CH_3$ | 2.1 | 1.5 | 118 | 5.5 |
| Example 5 | 2-Hydroxyisobutyric acid | 4.4 | 4.0 | N-Nonadecanoyl-N-methyl-β-alanine | $C_{18}H_{37}$ | $C_2H_4$ | $CH_3$ | 2.1 | 0.8 | 115 | 5.5 |
| Comparative Example 1 | 2-Hydroxyisobutyric acid | 4.4 | 4.0 | None | — | — | — | 2.1 | 109 | 128 | 8.1 |
| Comparative Example 2 | 2-Hydroxyisobutyric acid | 4.4 | 4.0 | Glycine | — | — | — | 2.1 | 87 | 122 | 10.5 |
| Comparative Example 3 | 2-Hydroxyisobutyric acid | 4.4 | 4.0 | Alanine | — | — | — | 2.1 | 98 | 121 | 10.7 | pH: The pH of the polishing composition after the addition of an oxidizing agent

TABLE 2

| | Acid | | | Anticorrosive | | | | | Etching amount (Å/20 min) | Polishing speed (Å/min) | Surface roughness (Å) |
|---|---|---|---|---|---|---|---|---|---|---|---|
| | Kind | pKa | Concentration (mass %) | Kind | $R^1$ | $R^2$ | $R^3$ | pH | | | |
| Example 6 | Maleic acid | 1.9 | 0.18 | N-Myristoyl-N-methyl-β-alanine | $C_{13}H_{27}$ | $C_2H_4$ | $CH_3$ | 2.1 | 92 | 128 | 7.8 |
| Comparative Example 4 | Maleic acid | 1.9 | 0.18 | None | — | — | — | 2.1 | 420 | 138 | 21.2 |

TABLE 2-continued

| | Acid | | | Anticorrosive | | | | | Etching amount (Å/20 mm) | Polishing speed (Å/min) | Surface roughness (Å) |
|---|---|---|---|---|---|---|---|---|---|---|---|
| | Kind | pKa | Concentration (mass %) | Kind | $R^1$ | $R^2$ | $R^3$ | pH | | | |
| Comparative Example 5 | Maleic acid | 1.9 | 0.18 | Glycine | — | — | — | 2.1 | 360 | 131 | 18.4 |
| Comparative Example 6 | Maleic acid | 1.9 | 0.18 | Alanine | — | — | — | 2.1 | 478 | 129 | 21.3 |
| Comparative Example 7 | Maleic acid | 1.9 | 0.18 | Histidine | — | — | — | 2.1 | 333 | 133 | 18.2 | pH: The pH of the polishing composition after the addition of an oxidizing agent

TABLE 3

| | Acid | | | Anticorrosive | | | | | Etching amount (Å/20 mm) | Polishing speed (Å/min) | Surface roughness (Å) |
|---|---|---|---|---|---|---|---|---|---|---|---|
| | Kind | pKa | Concentration (mass %) | Kind | $R^1$ | $R^2$ | $R^3$ | pH | | | |
| Example 7 | Malonic acid | 2.8 | 1.0 | N-Lauroyl-N-methyl-β-alanine | $C_{11}H_{23}$ | $C_2H_4$ | $CH_3$ | 2.1 | 72 | 131 | 8.1 |
| Example 8 | Malonic acid | 2.8 | 1.0 | N-Myristoyl-N-methyl-β-alanine | $C_{13}H_{27}$ | $C_2H_4$ | $CH_3$ | 2.1 | 66 | 128 | 7.9 |
| Comparative Example 8 | Malonic acid | 2.8 | 1.0 | None | — | — | — | 2.1 | 255 | 130 | 17.3 |
| Comparative Example 9 | Malonic acid | 2.8 | 1.0 | Glycine | — | — | — | 2.1 | 211 | 123 | 15.6 |
| Comparative Example 10 | Malonic acid | 2.8 | 1.0 | Alanine | — | — | — | 2.1 | 189 | 122 | 14.4 | pH: The pH of the polishing composition after the addition of an oxidizing agent From the results in Tables 1 to 3 above, it can be seen that when a polishing composition containing a specific anticorrosive is used as in Examples 1 to 8, as compared with Comparative Examples 1 to 10, the etching amount is reduced. This shows that by polishing with the polishing composition of the present invention, a substrate having a polished surface with lower surface roughness (RMS) (i.e., having excellent smoothness) can be obtained while maintaining the polishing speed.

It turned out that particularly when an anticorrosive in which the number of carbon atoms in the hydrophobic group represented by $R^1$ in the formula (1) is 11 to 18 is used as in Examples 3 to 5, the etching resistance further improves as compared with Examples 1 and 2. In addition, a comparison between Examples 1 to 5 and Examples 6 to 8 shows that the etching amount is further reduced when an acid having an acid dissociation constant (pKa) of 2.9 or more and less than 5.0 is used, and, as a result, a substrate having a polished surface with further improved surface roughness (RMS) can be obtained.

Incidentally, this application is based on Japanese Patent Application No. 2017-056433 filed on Mar. 22, 2017, the contents of which are entirely incorporated herein by reference.

The invention claimed is:

1. A polishing composition comprising:
    abrasive grains;
    an oxidizing agent;
    an acid;
    an anticorrosive containing a compound represented by the following formula (1) or a salt thereof; and
    a dispersing medium:

[Chemical Formula 1]

(1)

in the formula (1), $R^1$ is a linear or branched alkyl group having 14 or more and 30 or less carbon atoms or a linear or branched alkenyl group having 14 or more and 30 or less carbon atoms, $R^2$ is an ethylene group, and $R^3$ is a hydrogen atom or a linear or branched alkyl group having 1 or more and 10 or less carbon atoms,
wherein an acid dissociation constant (pKa) of the acid is higher than a pH of the composition.

2. The polishing composition according to claim 1, wherein $R^3$ in the formula (1) is an alkyl group having 1 or more and 3 or less carbon atoms.

3. The polishing composition according to claim 1, wherein the acid dissociation constant (pKa) of the acid is 2.9 or more and less than 5.0.

4. The polishing composition according to claim 1, wherein the acid is 2-hydroxyisobutyric acid.

5. The polishing composition according to claim 1, wherein $R^1$ in the formula (1) is a linear or branched alkyl group having 14 or more and 18 or less carbon atoms or a linear or branched alkenyl group having 14 or more and 18 or less carbon atoms.

6. The polishing composition according to claim 1, wherein the oxidizing agent is a peroxide.

7. The polishing composition according to claim 6, wherein the peroxide is at least one selected from the group consisting of hydrogen peroxide, peracetic acid, percarbonate, urea peroxide, sodium persulfate, potassium persulfate, ammonium persulfate, potassium peroxymonosulfate, and Oxone.

8. The polishing composition according to claim 1, wherein the abrasive grains are sulfonic acid-immobilized silica.

9. The polishing composition according to claim 1, wherein the polishing composition is for use in polishing an object to be polished having a layer containing a metal.

10. The polishing composition according to claim 9, wherein the metal is tungsten.

11. The polishing composition according to claim 1, wherein the pH of the composition is less than 3.0.

12. The polishing composition according to claim 1, wherein the pH of the composition is less than 2.9.

13. A method for producing the polishing composition set forth in claim 1, comprising mixing the abrasive grains, the oxidizing agent, the acid, the anticorrosive, and the dispersing medium.

14. A polishing method comprising polishing an object to be polished having a layer containing a metal using the polishing composition set forth in claim 1.

15. A method for producing a substrate comprising polishing an object to be polished having a layer containing a metal by the polishing method set forth in claim 14.

* * * * *